US008423306B2

(12) United States Patent
Duncan et al.

(10) Patent No.: US 8,423,306 B2
(45) Date of Patent: Apr. 16, 2013

(54) BATTERY DETECTION AND USER EXPERIENCE

(75) Inventors: Richard Jennings Duncan, Kirkland, WA (US); Ross Nathaniel Luengen, Sammamsih, WA (US); Latika Kirtane, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 777 days.

(21) Appl. No.: 12/125,632

(22) Filed: May 22, 2008

(65) Prior Publication Data

US 2009/0292487 A1    Nov. 26, 2009

(51) Int. Cl.
*G01R 31/36* (2006.01)
*G21C 17/00* (2006.01)

(52) U.S. Cl.
USPC .............................. 702/63; 702/182; 702/183

(58) Field of Classification Search .............. 702/63, 702/182, 183
See application file for complete search history.

(56) References Cited

U.S. PATENT DOCUMENTS

| | | | |
|---|---|---|---|
| 5,365,453 A | 11/1994 | Startup | |
| 5,691,742 A | 11/1997 | O'Connor | |
| 5,809,449 A | 9/1998 | Harper | |
| 6,252,511 B1 | 6/2001 | Mondshine | |
| 6,617,829 B1 | 9/2003 | Smith | |
| 6,710,578 B1 * | 3/2004 | Sklovsky | 320/127 |
| 7,024,321 B1 * | 4/2006 | Deninger et al. | 702/63 |
| 7,109,876 B2 | 9/2006 | Smith | |
| 7,211,987 B2 | 5/2007 | Aoki | |
| 2003/0132949 A1 | 7/2003 | Fallon | |
| 2004/0140904 A1 * | 7/2004 | Bertness | 340/636.15 |
| 2007/0004467 A1 * | 1/2007 | Chary | 455/572 |
| 2007/0188145 A1 | 8/2007 | Kim | |
| 2009/0167543 A1 * | 7/2009 | Bi | 340/636.1 |

OTHER PUBLICATIONS

"Laptop Battery Power Monitor v1.0," retrieved date Mar. 12, 2008, 3 pages, http://www.fileheap.com/software-laptop-battery-power-monitor-download-32133.html.
"Laptop Battery Monitor 1.0 Publisher's Description," retrieved date Mar. 12, 2008, 3 pages, http://www.download3k.com/System-Utilities/System-Maintenance/Download-Laptop-Battery-Monitor.html.
"BatteryMon," retrieved date Mar. 12, 2008, 3 pages, http://www.passmark.com/products/batmon.htm.
"Gkrellm-PMU," retrieved date Mar. 12, 2008, 2 pages, http://sourceforge.net/projects/gkrellm-pmu/.

* cited by examiner

*Primary Examiner* — Janet Suglo
(74) *Attorney, Agent, or Firm* — Shook, Hardy & Bacon L.L.P.

(57) ABSTRACT

A method and medium are provided for enabling reliable indication of the amount of time a battery will provide sufficient charge to power a computing device. In one embodiment, the time interval that lapses from the charge draining from the battery between two thresholds is determined, and the thresholds are adjusted based on the time interval. Other embodiments provide for classifying a battery as no longer capable of maintaining sufficient charge by comparing the maximum amount of charge the battery could store to the current maximum amount of charge the battery can currently store. Another embodiment determines how long a battery will provide sufficient charge to power a computing device based on profiles of user activity and associated battery drain rates. The current amount of charge stored in the battery is divided by the profile drain rate to determine how long the battery will provide sufficient charge to power the computing device.

7 Claims, 9 Drawing Sheets

BATTERY DETECTION AND USER EXPERIENCE

SUMMARY

Embodiments of the invention are defined by the claims below, but in summary, embodiments of the invention enable a reliable indication of the amount of time a battery will provide sufficient charge to power a computing device. One embodiment of the invention provides computer-readable media and computer-executable instructions embodied thereon for determining the time interval that lapses between charge of a battery draining from a first threshold level to a second threshold level. Notifications are presented at each threshold level to indicate the status of the battery. The threshold levels can be adjusted in order to provide a desired time interval between the first and second thresholds.

Other embodiments of the invention are directed to methods for classifying a battery as no longer capable of maintaining sufficient charge. Methods are provided for determining the maximum amount of charge that a battery was capable of storing and the current maximum amount of charge that a battery is capable of storing. The two determined amounts are compared, and based on that comparison the battery can be classified as no longer capable of maintaining sufficient charge. An indication can also be provided when the battery is classified as no longer capable of maintaining sufficient charge.

Another embodiment of the invention is directed to computer-readable media having computer-executable instructions embodied thereon for performing methods to determine the period of time that a battery will provide sufficient charge to power a computing device. Profiles are created for user activities on a computing device and the rate at which those activities drain charge from the battery is determined and stored along with the profile. The activity currently being engaged in by a user is analyzed to determine a profile of user activity that describes it. The period of time that the battery will provide sufficient power to the computing device is determined by dividing the amount of charge remaining in the battery by the drain rate of the determined profile of user activity.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the invention are described in detail below with reference to the drawing figures, which form a part of the disclosure and are incorporated by reference herein and wherein.

DETAILED DESCRIPTION

Figure 1:
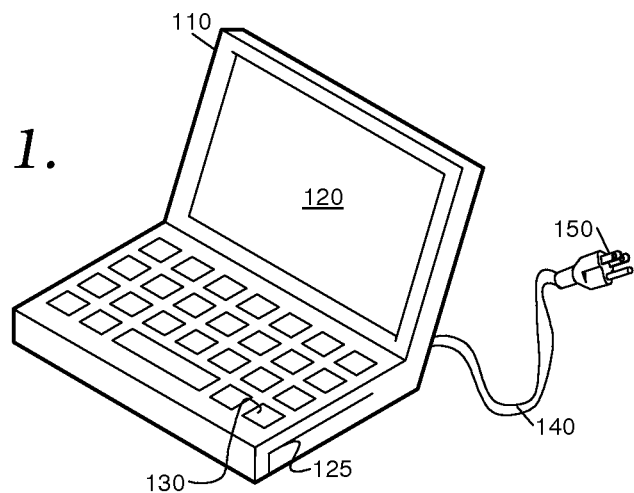
FIG. 1 is a block diagram illustrating an overview of a system in accordance with an embodiment of the invention.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

One embodiment of the present invention is directed to computer-readable media for performing a method of reliably indicating remaining operating time of a computer based on battery level. Two charge thresholds associated with two levels of battery charge are provided and a time interval that lapses between the battery level draining from one charge threshold to the other charge threshold is determined. A first low-battery notification is presented upon the charge in the battery reaching the first threshold and a second low-battery notification is presented upon the charge in the battery reaching the second threshold. The first and second threshold levels can be adjusted based on the time interval, and a more accurate indication of remaining battery is provided.

Another embodiment of the present invention is directed to methods for indicating battery level in a computing device. A prior maximum amount of charge that a battery was initially capable of storing and a current maximum amount of charge that the battery is capable of storing is determined and the two amounts are compared to each other. Based on the comparing, the battery level may be classified as no longer capable of maintaining sufficient charge. An indication can be provided that the battery is no longer capable of maintaining sufficient charge based on the battery's classification.

A further embodiment of the invention is directed to computer-readable media and methods embodied thereon for performing a method of determining the period of time that a battery will provide sufficient charge to power a computing device. A profile is created for types of user activity on the user device and the rate at which charge is drained from the battery for each profile is determined and stored. The user activity being engaged in by the user is then analyzed to determine a profile that describes the user activity. The period of time that the battery will provide sufficient charge is determined based on the amount of charge remaining in the battery and the rate at which charge is drained from the battery for the profile of user activity.

Having briefly described an overview of embodiments of the present invention, an exemplary computing device suitable for use in implementing embodiments of the present invention is described below.

Referring to the drawings in general, and initially to FIG. 1 in particular, an exemplary computing device for implementing embodiments of the present invention is shown and generally depicted as computing device 110. Computing device 110 is but one example of a suitable computing device and is not intended to suggest any limitations as to the scope of use or functionality of the invention. Any number of computing devices may make use of the embodiments of the present invention. For instance, cell phones, PDAs, GPS devices, smart phones, wireless devices, or any other computing device capable of being battery-powered can fall under the definition of the computing device contemplated herein.

Computing device 110 is comprised of a display 120, user input means 130 and device input/output means 125. Display 120 can take many different forms, such as an LCD display, CRT display, plasma display, or any other form that provides for the display of information by the computing device 110. The user input means 130 can be of any type generally recognized in the art, such as a keyboard, trackball, touch pad, stylus, microphone, or the like. Device input/output means 125 can comprise any number of input or output ports for the connection of external devices. These may take the form of connectors for USB, serial, parallel, Ethernet, Bluetooth, or IEEE 1394 fire wire devices. Although not depicted in FIG. 1, removable storage devices may be provided for reading and writing information to optical and/or magnetic storage media.

The computing device 110 also includes one or more batteries to power the computing device 110. The one or more batteries can be of any type, such as lithium ion or nickel cadmium for example. Other types of batteries are contemplated as well by embodiments of the present invention. Power plug 150 and electrical cord 140 serve to provide power to the computing device 110 when the power plug 150 is connected to a source of electricity, such as a typical electrical outlet supplied with electricity. Power cord 140 can be detachable from the computing device 110, and although not shown, may integrate a transformer to step down the voltage provided to the electrical outlet to a level suitable for use by the computing device 110.

The power transmitted by the power plug 150 and electrical cord 140 can also serve to charge the one or more batteries used by the computing device 110. While not depicted in FIG. 1, other means of powering the computing device 110 and charging the one or more batteries can be implemented. For instance, instead of relying on receiving electricity through a typical wall outlet, electricity may be received through one or more solar cells, as are known in the art.

Figure 2:
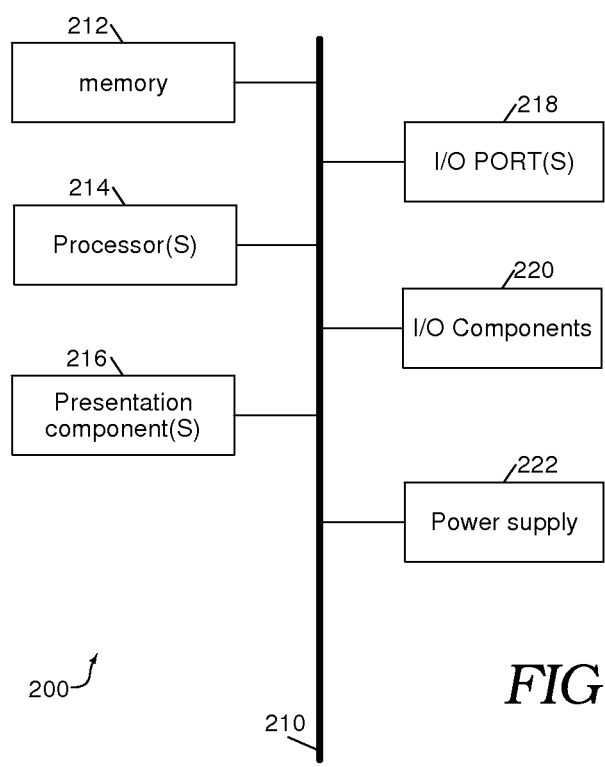
FIG. 2 is a block diagram of a computing system environment suitable for use in implementing embodiments of the present invention.

Turning now to FIG. 2, an exemplary operating environment for implementing embodiments of the present invention is shown and designated generally as computing device 200. Computing device 200 provides a higher level description of computing device 110.

As discussed above in relation to computing device 110, computing device 200 is but one example of a suitable computing environment and is not intended to suggest any limitation as to the scope of use or functionality of the invention. Neither should the illustrated computing environment be interpreted as having any dependency or requirement relating to any one or combination of components/modules illustrated.

The invention may be described in the general context of computer code or machine-useable instructions, including computer-executable instructions such as program components, being executed by a computer or other machine, such as a personal data assistant or other hand-held device. Generally, program components including routines, programs, objects, components, data structures, and the like, refer to code that performs particular tasks, or implements particular abstract data types. Embodiments of the present invention may be practiced in a variety of system configurations, including hand-held devices, consumer electronics, general-purpose computers, specialty-computing devices, and the like. Embodiments of the present invention may also be practiced in distributed computing environments where tasks are performed by remote-processing devices that are linked through a communications network.

With continued reference to FIG. 2, computing device 200 includes a bus 210 that directly or indirectly couples the following devices: memory 212, one or more processors 214, one or more presentation components 216, input/output (I/O) ports 218, I/O components 220, and an illustrative power supply 222. Bus 210 represents what may be one or more busses (such as an address bus, data bus, or combination thereof). Although the various blocks of FIG. 2 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors hereof recognize that such is the nature of the art, and reiterate that the diagram of FIG. 2 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 2 and reference to "computer" or "computing device."

Computing device 200 includes certain computer-readable media. By way of example, computer-readable media may comprise Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices that can be used to encode desired information and be accessed by computing device 200.

Memory 212 includes computer-storage media in the form of volatile and/or nonvolatile memory. The memory may be removable, non-removable, or a combination thereof. Exemplary hardware devices include solid-state memory, hard drives, optical-disk drives, and the like. Computing device 200 includes one or more processors that read data from various entities such as memory 212 or I/O components 220. Presentation component(s) 216 present data indications to a user or other device. Exemplary presentation components include a display device, speaker, printing component, vibrating component, etc. I/O ports 218 allow computing device 200 to be logically coupled to other devices including I/O components 220, some of which may be built-in. Illustrative components include a microphone, joystick, game advertisement, satellite dish, scanner, printer, wireless device, and the like.

Figure 3:
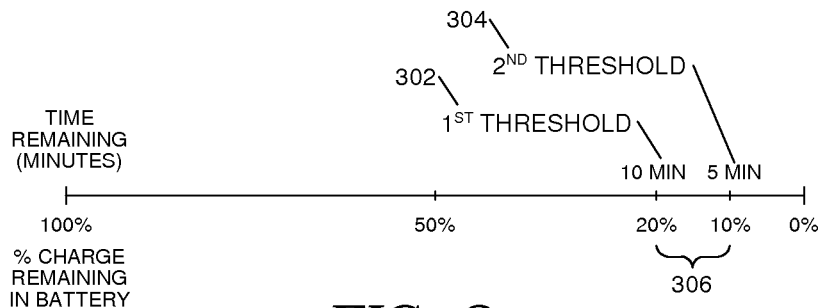
FIG. 3 is a diagram illustrating the relationship of charge remaining in a battery to a first and second threshold, according to an embodiment of the present invention.

Turning now to FIG. 3, a diagram depicting the relationship of charge remaining in a battery to a first and second threshold is presented, according to an embodiment of the present invention. The diagram depicts the percentage of charge remaining in a battery of a computing device 110 and relative amount of time that a given percentage of charge will power the computing device 110. A charge profile of a battery similar in condition to that of FIG. 3 is presented in conjunction with FIG. 6.

A first threshold 302 is reached when the charge remaining in the battery reaches a first level of charge. In the embodiment of the invention depicted in FIG. 3, this level is 20% of charge remaining in the battery. A second threshold 304 is reached when the charge remaining in the battery reaches a second level of charge. In the embodiment of the invention depicted in FIG. 3, this level is 10% of the charge remaining in the battery. Time interval 306 is the amount of time that elapses between the battery draining from the first threshold 302 to the second threshold 304.

Upon the determining that the charge remaining in the battery of the computing device 110 has reached the first threshold level 302, a first low-battery notification can be presented to a user of the computing device 110 in accordance with embodiments of the present invention. The details regarding determining the level of charge remaining in a battery are outside the scope of the embodiments of the invention. The level of charge can be communicated to the computing device 110 by one or more drivers for the battery, or it can be reported by hardware and/or software associated with the battery itself. Returning to the first low-battery notification, it can be a graphical and/or audible notification. The first low-battery notification can serve to warn the user that the battery is nearing a point at which it will no longer provide sufficient charge to power the computing device 100. In response to the first low-battery notification, the user can, for example, save any files they are working with or otherwise prepare to shut down the computing device 110.

When it is determined that the level of charge in the battery has reached the second threshold level 304, a second low-battery notification can be presented to the user of the computing device 110. The second low-battery notification can serve to warn the user of the computing device 110 that the battery will cease to provide adequate charge to power the computing device 110 in a short period of time. In response, the user can seek alternative modes of powering the computing device, such as connecting the power plug 150 to a typical electrical outlet that is supplied with electricity and connecting the power cord 140 to the computing device 110. Alternatively, a user can close the applications they are interacting with on the computing device 110 and shut down the computing device 110.

The time interval 306 is the amount of time that passes between the battery draining from the first threshold level 302 to the second threshold level 304. The time interval 306 can be measured and stored by the computing device 110. By providing a time interval 306 of sufficient duration, a user of the computing device 110 can be provided with adequate notice through a first and second low-battery notification of the amount of time which they can expect the computing device 110 to remain operable. The user therefore has time to seek an alternative power source for the computing device 110 as described above in relation to FIG. 1. Alternatively, a user can save information in applications they are working with and otherwise prepare to shut down the computing device 110. If the user fails to shutdown the computing device 110 before the level of charge in the battery reaches a point where there is insufficient charge to power the computing device 110, the computing device 110 will cease to operate. The computing device 110 can also employ a feature that automatically shuts down the computing device 110 upon reaching a critical charge threshold. The critical charge threshold can be reached soon after the second threshold level 304 is reached. The automatic shutdown of the computing device 110 can be provided to prevent damage to the computing device 110 that would otherwise result from a loss of power.

The methods described above for triggering the low-battery notifications based on a determination that the level of charge remaining in the battery has reached certain thresholds provide acceptable results early in the life of the battery. However, as the battery deteriorates over time and through regular use, the amount of time that the battery will provide sufficient charge to power the computing device 110 for a given level of charge remaining in the battery can decrease.

Figure 4:
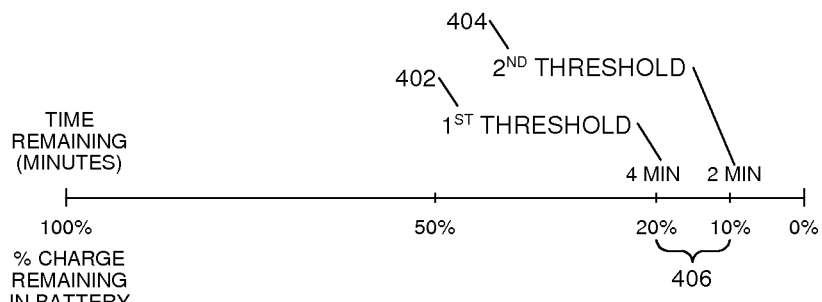
FIG. 4 is a diagram illustrating the relationship of charge remaining in a battery to a first and second threshold, according to an embodiment of the present invention.
Figure 7:
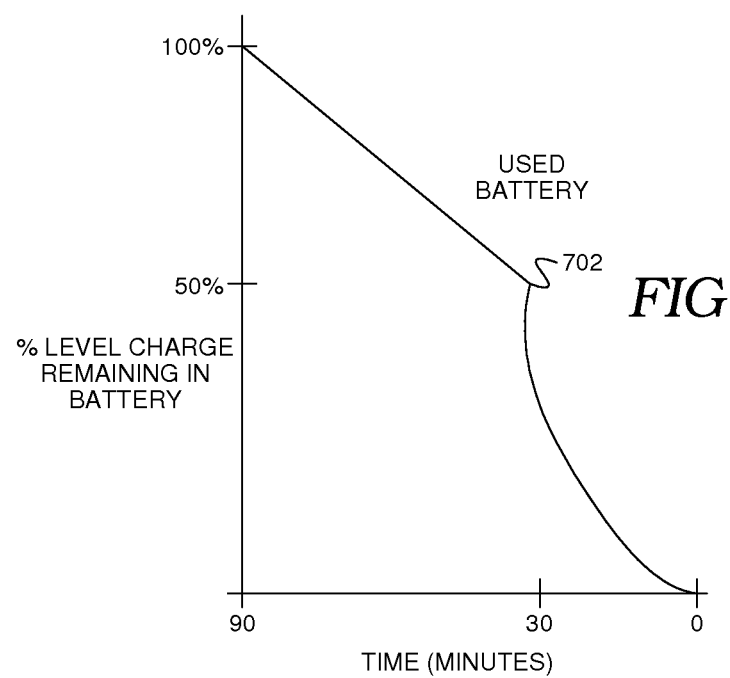
FIG. 7 is a graph illustrating the level of charge versus the amount of time the battery will provide sufficient charge to power a computing device, in accordance with an embodiment of the invention.

Turning now to FIG. 4, a diagram depicting the relationship of charge remaining in a battery to a first and second threshold is presented, according to an embodiment of the present invention. The diagram of FIG. 4 represents a battery that has deteriorated over time or through ordinary wear and tear. An exemplary charge profile of a battery in a similar state of deterioration is depicted in FIG. 7. The deterioration of particular batteries can be varied in nature. Some batteries may inherently deteriorate less over a given period of time, either through design of the battery or different usage patterns. A virtually endless number of factors can affect the deterioration of a battery over its respective lifetime.

As depicted in FIG. 4, the amount of time that the battery will continue to provide adequate charge to power the computing device 110 for a given level of charge remaining in the battery is dramatically less than that depicted in relation to FIG. 3 above. Accordingly, a significantly shorter time interval 406 is provided by associating the first threshold level 402 with the same level of charge as it was associated with in FIG. 3. The same holds true for the second threshold level 404. The user of the computing device 110 will likely not be satisfied that the time interval 406 has decreased from the time interval 306 presented in FIG. 3. The time interval 406 can even decrease to a point where the user does not have time to adequately prepare for a shutdown of the computing device 110. A scenario can occur where the user is presented with first and second low-battery notifications in such rapid succession that they have inadequate time to prepare for a shutdown or seek alternative sources of power for the computing device 110.

Embodiments of the present invention are directed to measuring the amount of time that passes between the level of charge reaching a first threshold and a second threshold. By measuring this period of time, the level of charge associated with each threshold can be adjusted to ensure a sufficient time interval is provided between the first and second thresholds.

Figure 5:
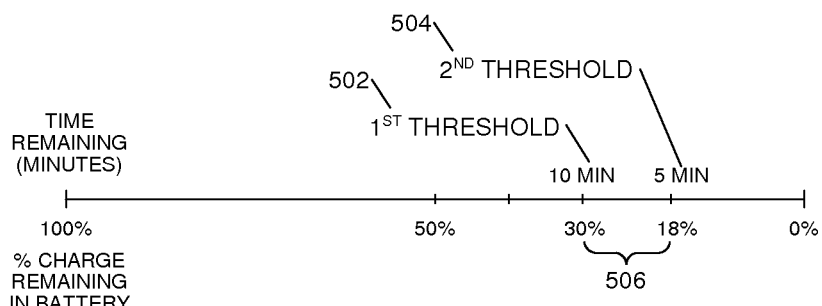
FIG. 5 is a diagram illustrating the relationship of charge remaining in a battery to a first and second threshold, according to an embodiment of the present invention.

FIG. 5 illustrates a diagram depicting the relationship of charge remaining in a battery to a first and second threshold, according to an embodiment of the present invention. As is evident in the drawing, the level of charge associated with the first threshold level 502 and the second threshold level 504 has been adjusted in order to provide a time interval 506 equal in duration to that of the time interval 306. The adjusting of the level of charge associated to the threshold levels can occur on a routine basis in some embodiments of the invention. The time interval would be determined each time the threshold levels were crossed and the associated charge levels would be adjusted accordingly. In this manner, any change in the length of the time interval would be minimized.

Other embodiments of the invention can trigger the adjustment of the level of charges after the time interval deviates by a predefined amount from a desired amount of time. One embodiment of the invention can provide for adjusting the levels of charge to provide for a time interval requested by the computing device 110 or a user of the computing device 110. For instance, a user could request a time interval of 20 minutes. The thresholds can then be adjusted accordingly to afford a time interval of 20 minutes. The levels could then be adjusted in the same manner as other embodiments of the invention so that the time interval can be maintained over the lifetime of the battery.

Figure 6:
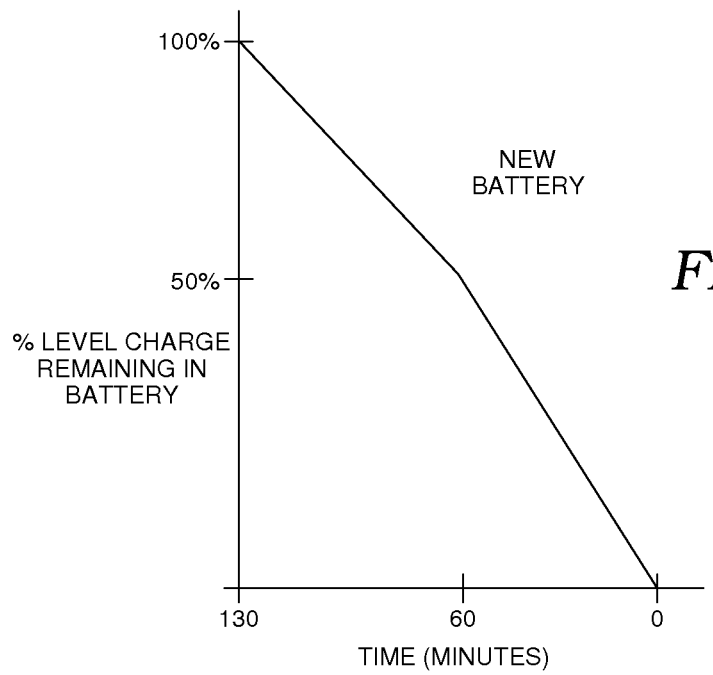
FIG. 6 is a graph illustrating the level of charge versus the amount of time the battery will provide sufficient charge to power a computing device, in accordance with an embodiment of the invention.

Turning now to FIGS. 6 and 7, graphs are presented illustrating the level of charge versus the amount of time the battery will provide sufficient charge to power the computing device 110, in accordance with an embodiment of the invention. The graphs presented in FIGS. 6 and 7 are referred to herein as charge profiles and the particular charge levels and time intervals presented are exemplary in nature and serve to provide a clearer presentation of the concepts described herein.

The charge profile depicted in FIG. 6 is that of a new battery that has suffered relatively little, if any, deterioration. An example of a battery in this state is a relatively new battery that has not been repeatedly discharged and recharged. The rate of dissipation of charge versus time elapsed is relatively linear over the discharge cycle where the battery charge levels are drained from a full charge level to approximately 50% charge level. The rate of dissipation of charge versus time elapsed remains linear from approximately 50% charge remaining in the battery to complete discharge of the battery. Accordingly, the amount of time required for the battery to drain from a full charge level to a 50% charge level and the amount of time required for the battery to drain from 50% charge level to complete discharge is roughly equal.

The charge profile depicted in FIG. 7 is that of a battery that has suffered deterioration over its lifetime. The cause of the deterioration can be attributed to any number of factors, a discussion of which is provided above in relation to FIG. 4. For example, the deterioration can be caused by repeated discharging and subsequent recharging of the battery over time. Additionally, excessive heat can cause acceleration in the deterioration of the battery. As evident in FIG. 7, the rate of dissipation of charge versus time is fairly linear for the first half of the discharge cycle. However, the rate becomes distinctively non-linear after approximately 50% of the charge in the battery has been dissipated at inflection point 702. The exact point at which the rate of dissipation of charge begins to increase can vary. Further, the change in the rate of dissipation of charge can be more gradual and a particular inflection point may not be readily ascertainable, as in FIG. 7. Accordingly, the depiction in FIG. 7 of the inflection point 702 has been exaggerated for purposes of discussion and clarity. The total length of time which the battery provides sufficient charge to power the user device decreases over the lifetime of the battery, as evident in FIGS. 6 and 7. Additionally, as the battery continues to deteriorate the rate of dissipation of charge can continue to increase as well.

The examples provided in FIGS. 6 and 7 depict a battery that when new or nearly new provided adequate charge for powering the computing device 110 for approximately 130 minutes. After the same battery had deteriorated to some extent, it only provides 90 minutes of adequate charge. While FIGS. 6 and 7 depict a change in the slope of the dissipation curve occurring when approximately 50% of the charge has been drained from the battery, this may not always be the case. For instance, the switch from a linear dissipation curve to a nonlinear dissipation curve can occur at different charge levels. In addition, the rate of change of the slope may never be linear and can, instead, increase over the discharge cycle. FIGS. 6 and 7 are provided as illustrative examples of discharge cycles, and accordingly were simplified for ease of presentation and discussion.

Figure 8:
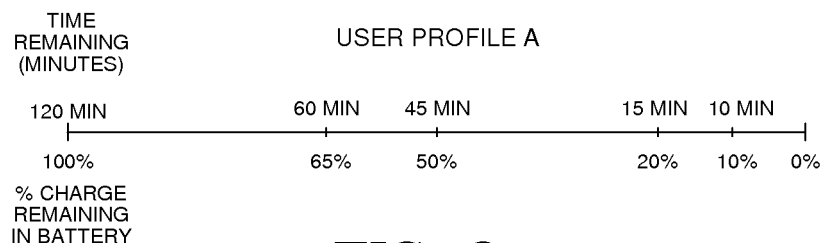
FIG. 8 is a diagram illustrating a battery drain profile for a user activity, in accordance with embodiments of the present invention.
Figure 9:
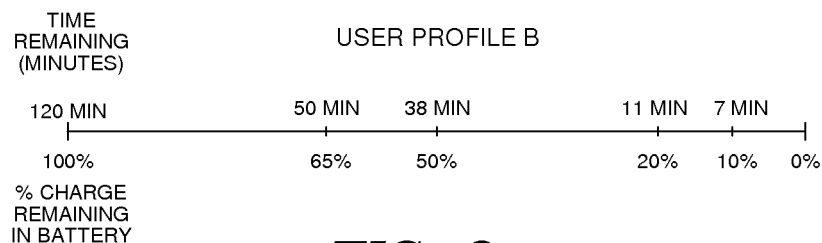
FIG. 9 is a diagram illustrating a battery drain profile for a user activity, in accordance with embodiments of the present invention.

Turning now to FIGS. 8 and 9, two battery drain profiles are presented for two corresponding user activities, in accordance with embodiments of the present invention. FIG. 8 depicts the level of charge remaining in a battery at several points along a discharge cycle and the corresponding amount of time that the battery will provide adequate charge to power the computing device 110.

The battery drain profile presented in FIG. 8 is a specific user activity and is entitled 'USER PROFILE A.' This profile can be generated automatically. The battery drain profile provides the rate at which charge is drained from the battery. Different user activities can result in different levels of power requirements and in turn different rates of charge drain from the battery. This can occur due to a host of factors, including but not limited to: processing requirements, display brightness levels, audio generation, use of peripherals such as storage drives, charge consumed by external devices connected to the computing device 110, or use of a wireless networking adapter by the computing device 110. The preceding list is not meant to be exhaustive, and it should be understood that any number of factors can contribute to the power consumption of a computing device 110.

FIG. 9 depicts a battery drain profile for a specific user activity, entitled 'USER PROFILE B.' This profile can be generated automatically. By comparing FIG. 9 to FIG. 8 it is clear that the user activity for the battery drain profile of FIG. 9 consumes more power than that of the user activity profiled in FIG. 8. By way of example, the user activity represented by 'USER PROFILE B' could be that of a user viewing a DVD movie on the computing device 110, while the user activity represented by 'USER PROFILE A' could be that of a user utilizing a web browser and a wireless network adapter on the computing device 110. It should be understood that user profiles can be generated for a single user activity, or multiple user activities occurring simultaneously.

Figure 10:
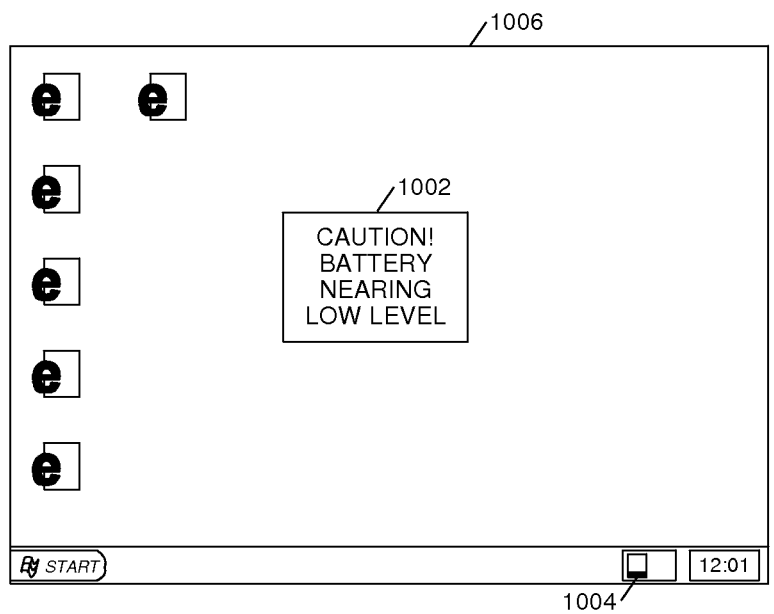
FIG. 10 is a diagram illustrating an exemplary low-battery notification, according to one embodiment of the invention.

Turning now to FIG. 10, an exemplary low-battery notification is presented, according to one embodiment of the invention. A user interface 1006 of the computing device 110 is depicted. A battery level indicator 1004 is displayed in the corner of the user interface 1006 and a low-battery notification 1002 is presented. The low-battery notification 1002 may be either a first low-battery notification or a second low-battery notification as described in relation to FIGS. 3-5 above. The text of the low-battery notification 1002 can be different according to other embodiments of the invention. Any suitable text that presented a notification to the user of the computing device 110 that the battery was nearing a level of charge that would be inadequate for powering the computing device 110 would suffice.

Although not depicted in FIG. 10, an audible and/or vibratory notification could be presented to alert the user to the level of charge remaining in the battery. This audible and/or vibratory alert could either be presented alone, or in conjunction with the low-battery notification 1002. Additionally, the text presented in the low-battery notification can change depending on whether it is a first low-battery notification or a second low-battery notification. The same would true for an audible and/or vibratory notification. While visual, audible, and vibratory notifications have been discussed, that list is not meant to be exclusive. Any notification means that would alert a user to the charge level remaining in the battery of the computing device is contemplated by embodiments of the present invention.

Figure 11:
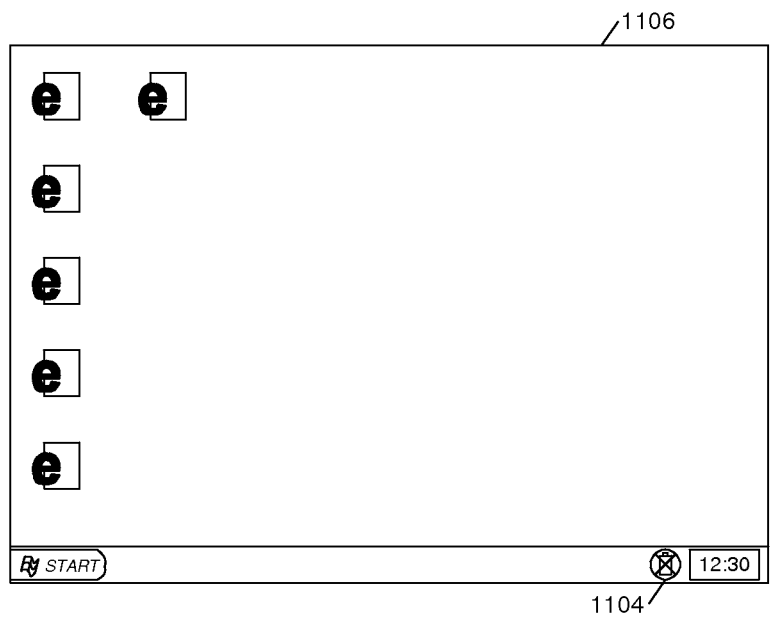
FIG. 11 is a diagram illustrating an exemplary battery notification, according to one embodiment of the invention.

Continuing now to FIG. 11, an exemplary battery notification is presented, according to one embodiment of the invention. A user interface 1106 of the computing device 110 is depicted. A battery notification 1104 is presented, serving to alert the user as to the status of the battery of the computing device 110. Any number of statuses could be indicated by the battery notification 1104. For instance, upon a determination that the battery is no longer capable of maintaining sufficient charge, the battery notification 1104 can be presented in the user interface 1106, as depicted in FIG. 11. The particular battery notification 1104 depicts a battery symbol in conjunction with an 'X' symbol in order to indicate to the user that the battery is no longer capable of maintaining sufficient charge to power the computing device 110. Although not depicted in FIG. 11, a user can be presented with a link to the website of a vendor that sells replacement batteries in conjunction with the battery notification 1104.

Other types of battery notifications 1104 could be presented in the user interface as well. For example, the temperature of the battery of the computing device 110 could be monitored, and when it exceeds a predefined temperature a battery notification 1104 can be presented to the user. The notification could include text warning the user as to the status of the battery.

Other battery notifications 1104 could be presented upon determining that a battery is defective. This can occur when information is received at the computing device 110 that includes certain criteria that can be used to identify a defective battery. The information may be communicated over a network to the computing device 110. The information can include a distinguishing manufacturing number for the battery, such as a serial number, or a date of manufacture or particular model number. The battery can then be automatically inspected to determine whether it satisfies the criteria. A battery notification 1104 can then be automatically provided to notify the user that the battery is defective and satisfies the received criteria. This would be particularly useful to facilitate notifying battery owners about battery recalls issued by battery manufacturers.

Figure 12:
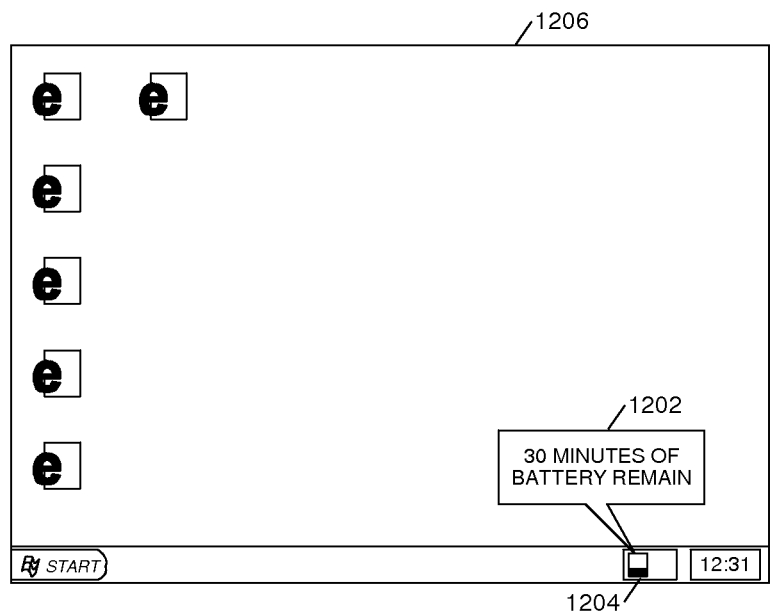
FIG. 12 is a diagram illustrating an exemplary battery time-remaining notification, according to an embodiment of the present invention.

Turning now to FIG. 12, a depiction of an exemplary battery time-remaining notification is presented, according to an embodiment of the present invention. A battery charge level indicator 1204 and battery time-remaining notification 1202 are presented in the user interface 1206 of the computing device 110. The time-remaining notification 1202 presents to the user of the computing device the amount of time that the battery can be expected to provide sufficient charge to power the computing device 110. This amount of time can be determined by consulting one of the battery drain profiles discussed in relation to FIGS. 8 and 9. Other embodiments of the invention can use the time-remaining notification 1202 as a means to present the first low-battery notification and/or second low-battery notification. While the time-remaining notification 1202 is depicted as being attached to the battery level indicator 1204, it can also be a separate text box that is not connected to battery level indicator 1204.

Figure 13:
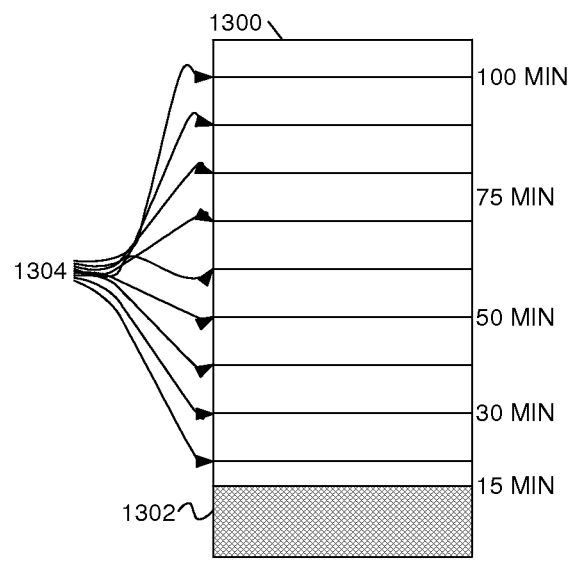
FIG. 13 is a diagram illustrating a remaining battery life notification, in accordance with an embodiment of the present invention.

With reference now to FIG. 13, a remaining battery life notification is presented in accordance with an embodiment of the present invention. Remaining battery life notification 1300 provides a graphic representation of the level of charge present in the battery. Incremental marks 1304 are provided along the length of the remaining battery life notification 1300 to provide a visual cue to the user as to charge remaining in the battery. The level of charge is indicated by filling in the remaining battery life notification 1300 to an area 1302 approximating the remaining charge. A scale is also presented along one side of the remaining battery life notification that permits a user to determine the amount of time the battery will provide sufficient charge to power the computing device 110 based on the size of the area 1302.

Figure 14:
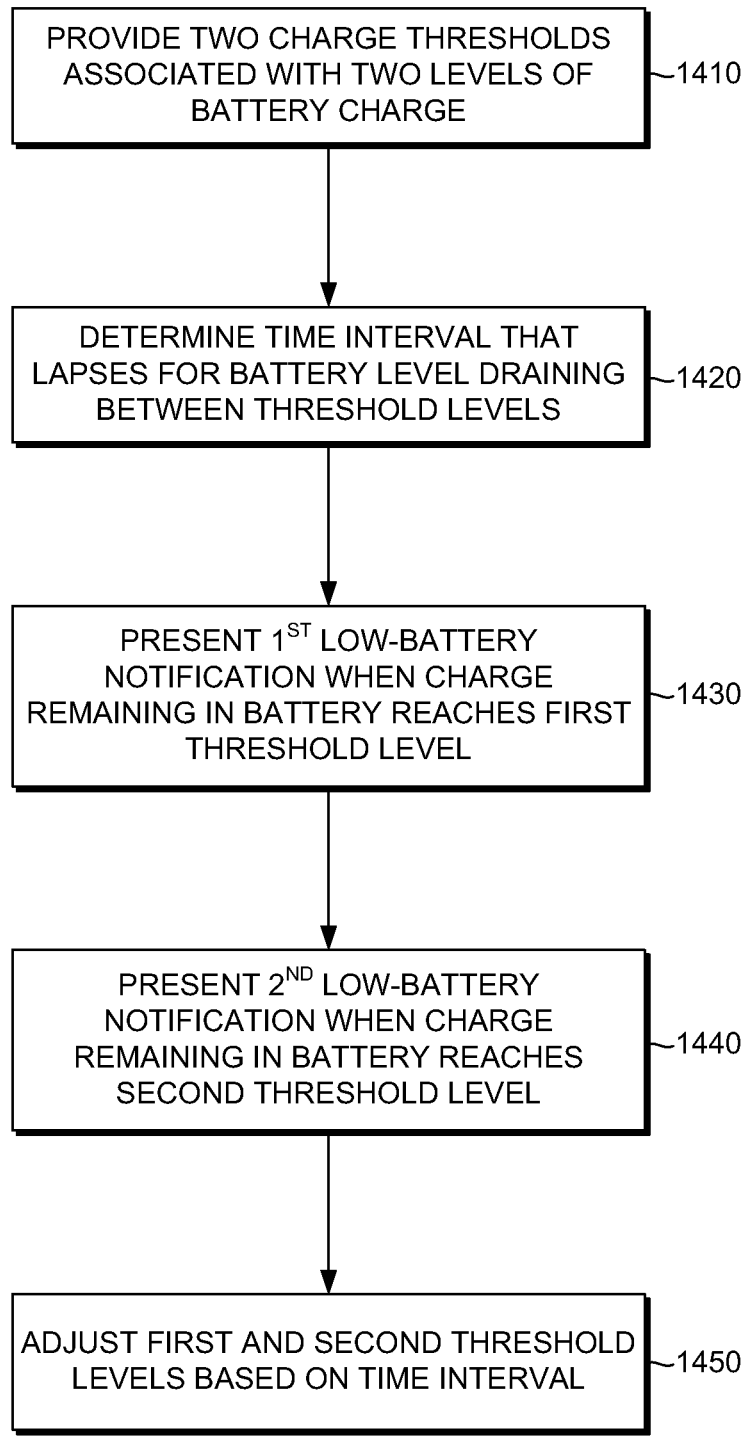
FIG. 14 is block diagram illustrating a method of reliably indicating remaining operating time of a computer based on battery level, according to an embodiment of the present invention.

Turning to FIG. 14, a block diagram depicting a method of reliably indicating remaining operating time of a computer based on battery level is depicted according to an embodiment of the present invention. The method begins at block 1410 with the providing of two charge thresholds associated with two levels of battery charge. A first threshold is associated with a first threshold level and a second threshold is associated with a second threshold level. In block 1420, a determination is made for a given computer-usage level of the time interval that lapses between a battery level draining from the first threshold level to the second threshold level.

In block 1430, it is determined when the charge remaining in the battery reaches the first threshold level and a first low-battery notification is presented based on the determination. The first low-battery notification can take a variety of forms, such as discussed in relation to FIGS. 3-5 and 10-12 above. In addition, in response to the determining that the charge remaining in the battery reached the first threshold level, the calculated rate at which the computing device 110 drains charge from the battery can be altered. The altering can be accomplished by deactivating components or processes operating on the computing device. For instance, the power supply to a peripheral device could be shut off.

At block 1440, it is determined when the charge remaining in the battery decreases to the second threshold level and a second low-battery notification is presented based on the determination. In block 1450, first and second threshold levels are adjusted based on the time interval, thereby providing a more accurate indication of the remaining battery than if the time interval had not been accounted for. To adjust the first threshold level or the second threshold level the level of battery associated with each may be decreased or increased. In this manner, if the time interval that passed between the determining that the charge has reached the first threshold level and the charge reaching the second threshold level is not of long enough duration, the levels of charge associated with one or both of the threshold levels can be increased or decreased in order to provide the desired time interval. Further, a desired time interval can be received from the user of the computing device 110 that defines an amount of time that is requested to elapse between the first low-battery notification and the second low-battery notification. The first and second threshold levels can then be adjusted accordingly in order to meet the desired time interval.

Figure 15:
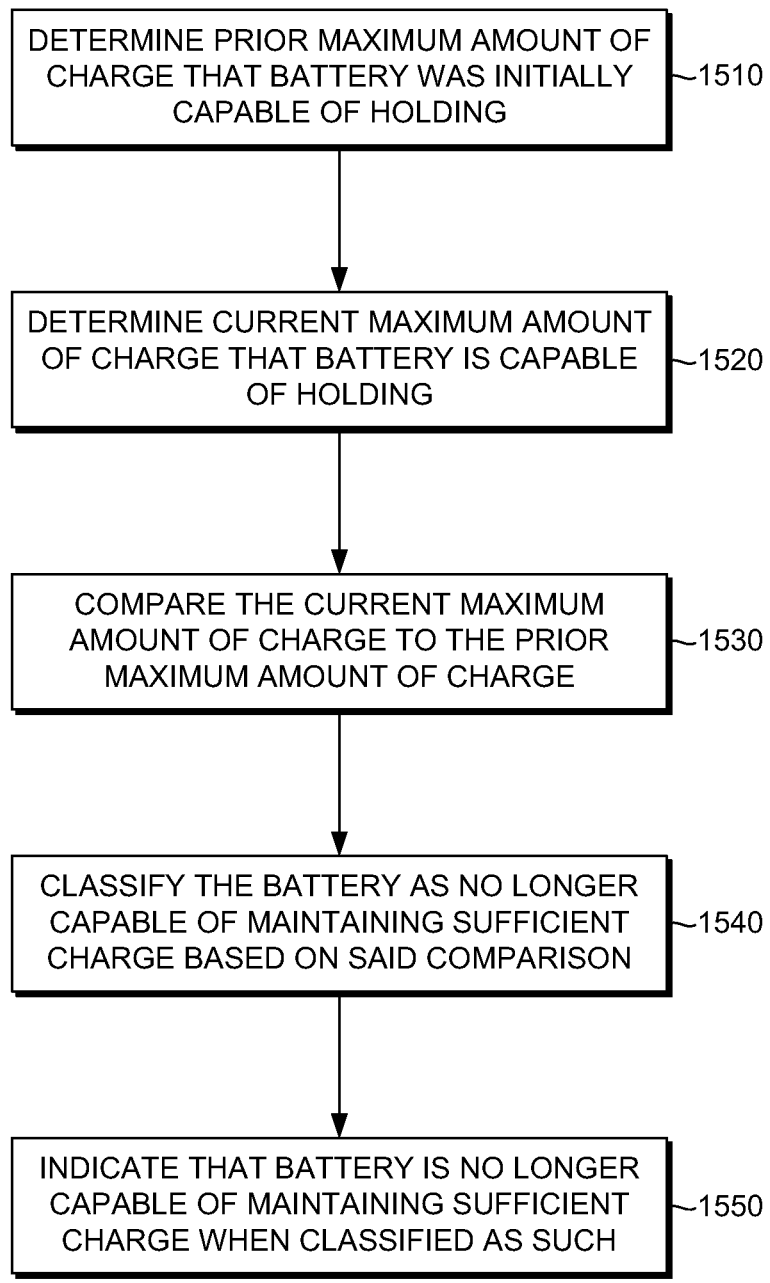
FIG. 15 is a block diagram illustrating a method of indicating battery level of a battery in a computing device, according to an embodiment of the invention.

Turning now to FIG. 15, a block diagram depicting a method indicating the battery level of a battery in a computing device is presented, according to an embodiment of the invention. The method begins at block 1510 with determining a prior maximum amount of charge the battery was initially capable of storing. This information can be provided by any number of sources, including the battery itself. Additionally, it can be the amount of charge that the battery was initially capable of storing at the time it was manufactured.

In block 1520 the current maximum amount of charge that the battery is capable of storing is determined. The amount of charge determined in blocks 1510 and 1520 are then compared to each other in block 1530. The comparing can involve calculating the ratio of the current maximum amount of charge to the maximum amount of charge that the battery was capable of storing initially or at the time of manufacture.

At block 1540, the battery can be classified as no longer capable of maintaining sufficient charge based on the comparison conducted in block 1530. Additionally, when the ratio of the current maximum amount of charge to the maximum amount of charge that the battery was capable of storing initially or at the time of manufacture is below a predefined value, the battery can be classified as no longer capable of maintaining sufficient charge.

An indication that the battery is no longer capable of maintaining sufficient charge can be made when the battery is no longer capable of maintaining sufficient charge, as described in block 1550. The indication of block 1550 can include a graphical notification presented to the user of the computing device 110 as discussed in relation to FIG. 11 above. Further, the indication can also include the presentation to the user of an opportunity to purchase a replacement battery when the battery is classified as no longer capable of maintaining sufficient charge. In another embodiment of the invention, an indication can be presented to the user when the computing device 110 is being powered from another source and that the battery is no longer capable of maintaining sufficient charge. In this embodiment the user will then be provided notice that they should not disconnect the other source of power, as doing so will cause a loss of power to the computing device 110 since the battery is not operative for its intended purpose of supplying charge to operate the computing device 110.

Figure 16:
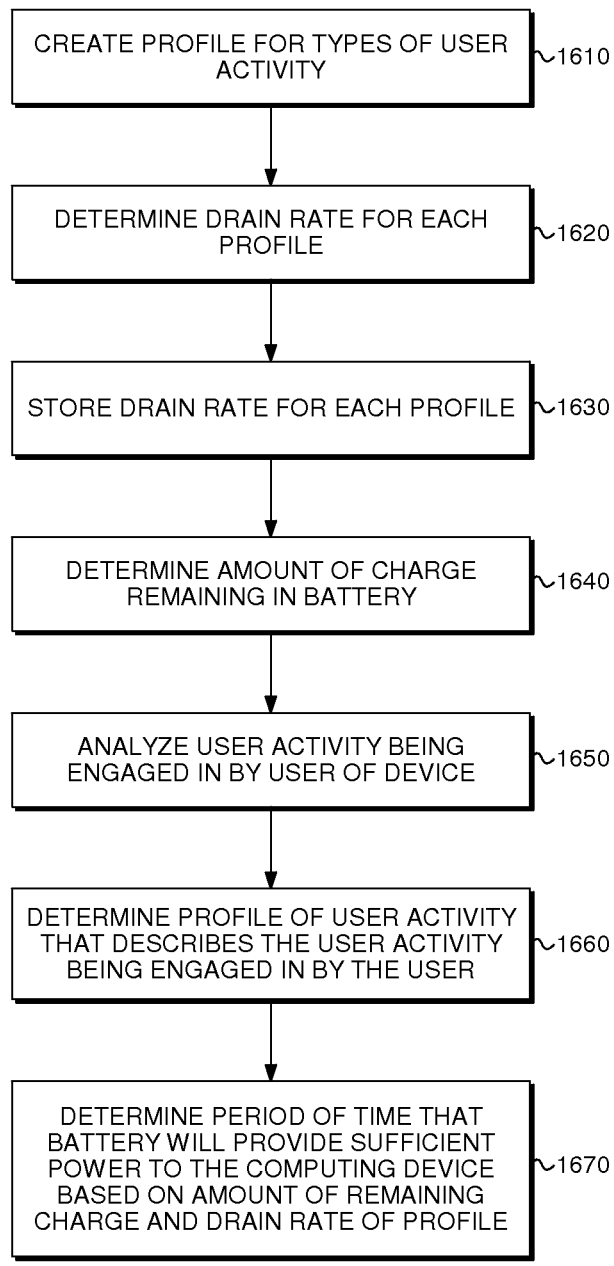
FIG. 16 is a block diagram illustrating a method for determining the period of time that a battery will provide sufficient charge to power a computing device, according to an embodiment of the present invention.

Turning now to FIG. 16, a block diagram depicting a method for determining the period of time that a battery will provide sufficient charge to power a computing device is presented, according to an embodiment of the present invention. The method begins at block 1610 with the automatic creation of a profile for one or more types of user activity. The profile of user activity can include information describing usage of internal and external hardware components of the computing device 110 and software processes employed on the computing device 110. Additionally, FIGS. 8 and 9 and the discussion provided therein, provide exemplary embodiments of the present invention with regard to user profiles and the rate of battery drain for each profile of user activity. Further, an extensive discussion of the different types of user activity that can be profiled is provided.

Although not depicted in FIG. 16, a system profile can be automatically created that includes information on activities and processes executed on the computing device 110 regardless of any additional user activity. The activities and processes can be system background processes, as is known in the art. A drain rate can be determined for the system profile that defines the rate at which charge is drained from the battery for the system profile. The drain rate can then be stored with the system profile.

The rate at which charge drains for each profile of user activity, hereinafter a drain rate, is then determined for each profile of user activity in block 1620. The drain rate is then stored for each profile in block 1630. The amount of charge remaining in the battery is determined at block 1640.

The user activity being engaged in is then analyzed in block 1650. A determination can also be made as to whether the user activity being engaged in is described by a single profile of user activity. When the user activity is described by more than one profile, a process can be conducted that includes the following steps—for each of the profiles that describes a portion of the user activity, the system profile drain is subtracted from said profile describing a portion of user activity resulting in a net drain rate for each profile. Each net drain rate is then summed together and the system profile drain is then added to the sum of the net drain rates. This results in a gross profile drain rate at which charge is drained from the battery for the activity being engaged in by the user of the computing device. The gross profile drain rate is then stored in a memory component of the computing device 110.

In block 1660 it is then determined which profile of user activity describes the activity currently being engaged in by the user. The period of time that the battery will provide sufficient charge to power the computing device is determined based on the amount of remaining charge in the battery and on the drain rate at which charge is drained from the battery for the determined profile of user activity in block 1670. The period of time can be determined by dividing the amount of charge remaining in the battery by the drain of the user profile. In embodiments of the invention where a gross profile drain rate is necessarily calculated, the period of time that the battery will provide sufficient charge to power the computing device 110 can be determined by dividing the amount of charge remaining in the battery by the gross profile drain rate.

Many different arrangements of the various components depicted, as well as components not shown, are possible without departing from the spirit and scope of the present invention. For instance, while specific depictions of low-battery notifications have been presented herein, in no way should the present invention be deemed to be limited to the presented depictions. Any number of notifications in a multitude of forms can be utilized by the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It should also be understood that certain features and subcombinations are of utility and may be employed without reference to other features and subcombinations and are contemplated within the scope of the claims. Additionally, not all steps listed in the various figures need be carried out in the specific order described.

The invention claimed is:

1. One or more tangible computer-readable storage media having computer-executable instructions embodied thereon for performing a method of reliably indicating remaining operating time of a computer based on battery level, the method comprising:

for a given computer-usage level, receiving a user-specified time interval that lapses between a battery level draining from a first threshold level to a second threshold level;

associating a first level of battery charge with the first threshold level and a second level of battery charge with the second threshold level;

determining when the charge remaining in the battery reaches the first level of battery charge associated with the first threshold level and presenting a first low-battery notification based on said determining for the given computer-usage level;

determining when the charge remaining in the battery decreases to the second level of battery charge associated with the second threshold level and presenting a second low-battery notification based on said determining for the given computer-usage level; and adjusting at least one of the first threshold level and the second threshold level according to said user-specified time interval, thereby altering at least one of the first level of battery charge and the second level of battery charge at which a notification is received to provide an indication of battery charge remaining according to the user-specified time interval.

2. The media of claim 1, further comprising, in response to the determining that the charge remaining in the battery has reached the first threshold level, altering a calculated rate at which the computer drains charge from the battery.

3. The media of claim 2, wherein the altering of the calculated rate at which the computer drains charge from the battery is accomplished by deactivating components or processes of the computer.

4. The media of claim 1, wherein the user-defined time interval that defines an amount of time that is requested to elapse between the first low-battery notification and the second low-battery notification remains constant with deteriorating battery life.

5. The media of claim 4, wherein adjusting at least one of the first threshold level and the second threshold level maintains the user-specified lapse of time as the battery deteriorates with life.

6. The media of claim 1, further comprising:
receiving information that includes criteria useable to identify a defective battery,
automatically inspecting the battery to determine whether it satisfies said criteria; and
automatically providing a notification that said battery is defective if the battery satisfies said criteria.

7. The media of claim 1, further comprising monitoring a temperature of the battery, and providing a temperature-warning notification if the battery temperature exceeds a temperature threshold.

* * * * *